United States Patent [19]
Grassmann

[11] Patent Number: 6,063,530
[45] Date of Patent: *May 16, 2000

[54] CONTROL OF CRITICAL DIMENSIONS THROUGH MEASUREMENT OF ABSORBED RADIATION

[75] Inventor: Andreas Grassmann, Bad Abbach, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/999,926

[22] Filed: Jun. 23, 1997

[51] Int. Cl.$^7$ ........................................ G03F 9/00
[52] U.S. Cl. .................................................. 430/30
[58] Field of Search ................................. 430/30

[56] References Cited

U.S. PATENT DOCUMENTS 5,124,216  6/1992  Giapis et al. ............................. 430/30
5,674,652  10/1997  Bishop et al. ............................ 430/30

*Primary Examiner*—Christopher G. Young
*Attorney, Agent, or Firm*—Stanton C. Braden

[57] ABSTRACT

A lithographic system with improved control of critical dimensions (CD). The lithographic system includes a detector for determining the amount of energy absorbed by the photoresist. This enables the lithographic system to expose each field with the required exposure dose, thus reducing variations in CD.

1 Claim, 6 Drawing Sheets

CONTROL OF CRITICAL DIMENSIONS THROUGH MEASUREMENT OF ABSORBED RADIATION

BACKGROUND OF THE INVENTION

The invention relates generally to integrated circuit fabrication and more particularly to the patterning of photoresist layers.

In device fabrication, insulating, semiconducting, and conducting layers are formed on a substrate or wafer. The layers are patterned to create features and spaces, forming devices, such as transistors, capacitors, and resistors. These devices are then interconnected to achieve a desired electrical function.

Patterning of the various device layers is achieved with lithography. Lithography refers to the process of projecting an image from a mask onto the surface of the wafer. The image illuminates a resist layer formed on the surface of the wafer, exposing it with the desired pattern. The exposure dose that used to expose the resist layer is sufficient to develop it. The exposure dose is defined as the radiation energy per unit area, which is in $mJ/cm^2$. Depending on whether a positive or negative photoresist is used, the exposed or unexposed portions of the resist layer are removed. The portions not protected by the resist are then, for example, etched to form features and spaces on the wafer.

The dimensions of the features and spaces depend on the resolution capability of the lithographic systems. The minimum feature size (F) achieved by a given generation of lithographic systems is referred to as the lithographic groundrule. Critical dimension (CD) is defined as the minimum feature size that must be controlled. This includes, for example, linewidths, spacing, and contact width.

In conventional lithography, variations in CD occur. Such variations are caused by, for example, variations in the incoupling of the exposure radiation into the photoresist. Incoupling refers to the amount of exposure energy absorbed by the photoactive compound in the photoresist. These variations are typically caused by variable optical properties like: non-uniformity of film deposition across the wafer; wafer to wafer dielectric thickness variations; resist thickness variations; and resist application variations (softbake temperatures, etc.).

With continuously shrinking dimensions, the ability to control CD becomes increasingly more critical. In particular, variations in incoupling of the exposure source into the photoresist can cause CD variations to exceed specified tolerances, thereby adversely impacting manufacturing yield.

To combat the adverse impact caused by excessive variations in CD, an antireflective coating (ARC) is used. Typically, the thickness of the ARC is determined by a time consuming optimization process. Although ARC has been effective in improving CD control, its use is expensive and requires additional processing steps.

From the above discussion, there is a need to improve CD control.

SUMMARY OF THE INVENTION

In accordance with one feature of the invention, a method of transferring a mask pattern to a photoresist layer is provided. The method includes the steps of placing a mask over the photoresist layer with an optical projection lens therebetween. A source of light energy is placed over the mask. Light energy from the source passing through the mask is directed as incident light on the photoresist after passing through the lens. Power to the source of light energy is controlled in accordance with a measurement of the light energy reflected back toward the incident light.

With such method, the size of the aperture in the photoresist layer is controlled in accordance with the amount of light energy actually absorbed in the photoresist layer rather on a priori determined statistical properties of the process used to establish a fixed exposure time for the process.

In accordance with another feature of the invention, a method of transferring a mask to a photoresist layer is provided. The method includes placing the photoresist layer on the surface of a structure. A mask is placed over the photoresist layer with an optical lens therebetween. A source of light energy is placed over the mask and directed through exposed portions of the mask as incident light on the photoresist layer. The amount of incident light energy reflected and the amount of light energy incident on the photoresist layer are measured. Power to the light source is controlled in accordance with the measured light energies. More particularly, power to the light source is terminated when the measured light energies produce an indication that the amount of light absorbed by the photoresist layer has reached a predetermined threshold level. The predetermined threshold level is selected in accordance with the size of the aperture to be formed in the photoresist layer.

BRIEF DESCRIPTION OF THE DRAWING

These and other features and advantages of the invention will become more readily apparent when taken together with the following detailed description and the following drawings, in which.

DETAILED DESCRIPTION

The present invention relates to improved CD control in lithography. Improved CD control is achieved by controlling the exposure dose of the photoresist. To facilitate discussion of the invention, a description of a conventional lithographic system is provided.

Figure 1:
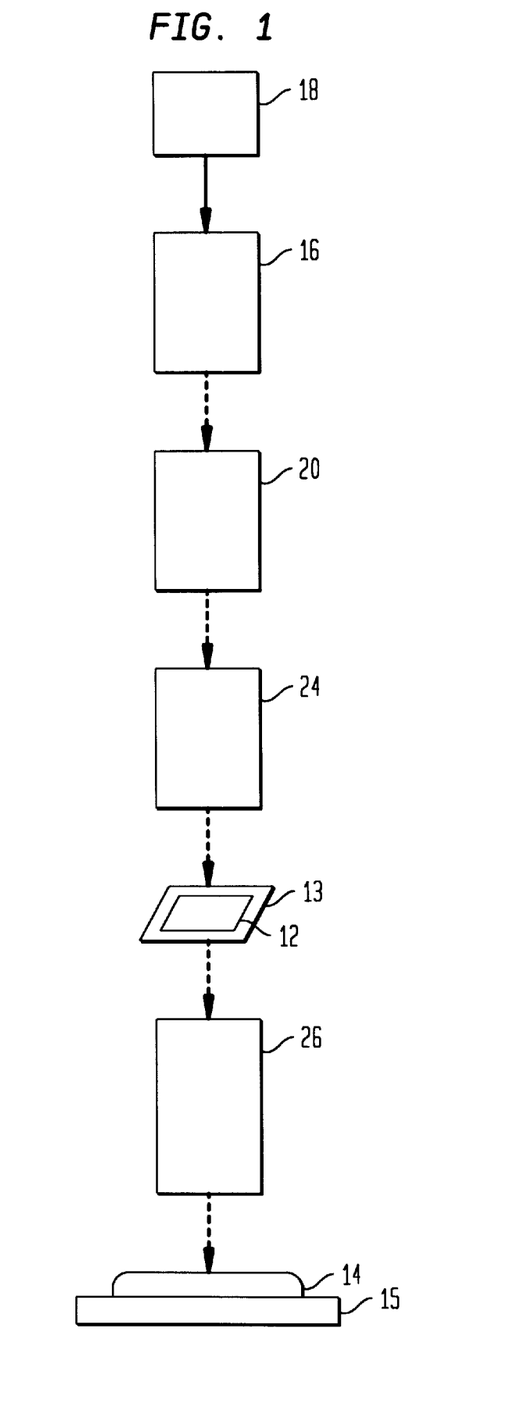
FIG. 1 is a diagrammatical sketch of a conventional lithographic system used to transfer a pattern of a mask onto a photoresist layer.

In FIG. 1, a simplified illustration of a conventional projection printer such as a stepper for fabricating devices is shown. Such systems, for example, are described in Pol et al., *Excimer Laser-based lithography: a Deep Ultraviolet Wafer Stepper*, SPIE vol. 633, 6 (1986) and Unger et al., *Design and Performance of a Production-worthy Excimer Laser-Based Stepper*, SPIE vol. 1674, (1992), both herein incorporated by reference for all purposes. The projection printer comprises an exposure source 110. Power to the exposure source is provided by a power supply 18. The projection printer also includes a beam delivery subsystem 20, an illuminator 24, a mask frame 13 for mounting a mask 12, a projection lens 26, and a stage 30 for mounting a substrate 14 such as a semiconductor wafer.

In operation, the exposure source 16 sends radiation through the beam delivery subsystem 20. Typically, the beam delivery subsystem comprises various mirrors and/or reflective elements such as lenses to direct the radiation into the illuminator. The illuminator 24 receives the radiation and spatially manipulates the energy therefrom to provide optimum illumination of mask 12. The mask contains regions that are translucent and opaque to the radiation. These regions form a pattern that corresponds to, for example, circuit features. Projection lens 26 then projects the image of the mask onto a layer of photoresist covering a wafer 14 which is mounted on stage 30. Where the image of the mask is de-magnified by the projection lens, the mask is referred to as a reticle. Typically, the projection lens comprises a collection of lenses. The stage includes precision translation and rotation control by a computer (not shown) for accurate pattern alignment.

In a stepper, the image of the mask is projected onto a portion of the wafer to expose the photoresist therein. The portion of the wafer being exposed is referred to as the exposure field. Once a predetermined exposure dose has been delivered to the exposure field, the stage translates or steps the wafer to expose a subsequent exposure field.

As previously described, conventional lithographic systems have difficulty in controlling CD variations. In some instances, variations in CD exceed specified tolerances, detrimentally affecting output yields.

Figure 2:
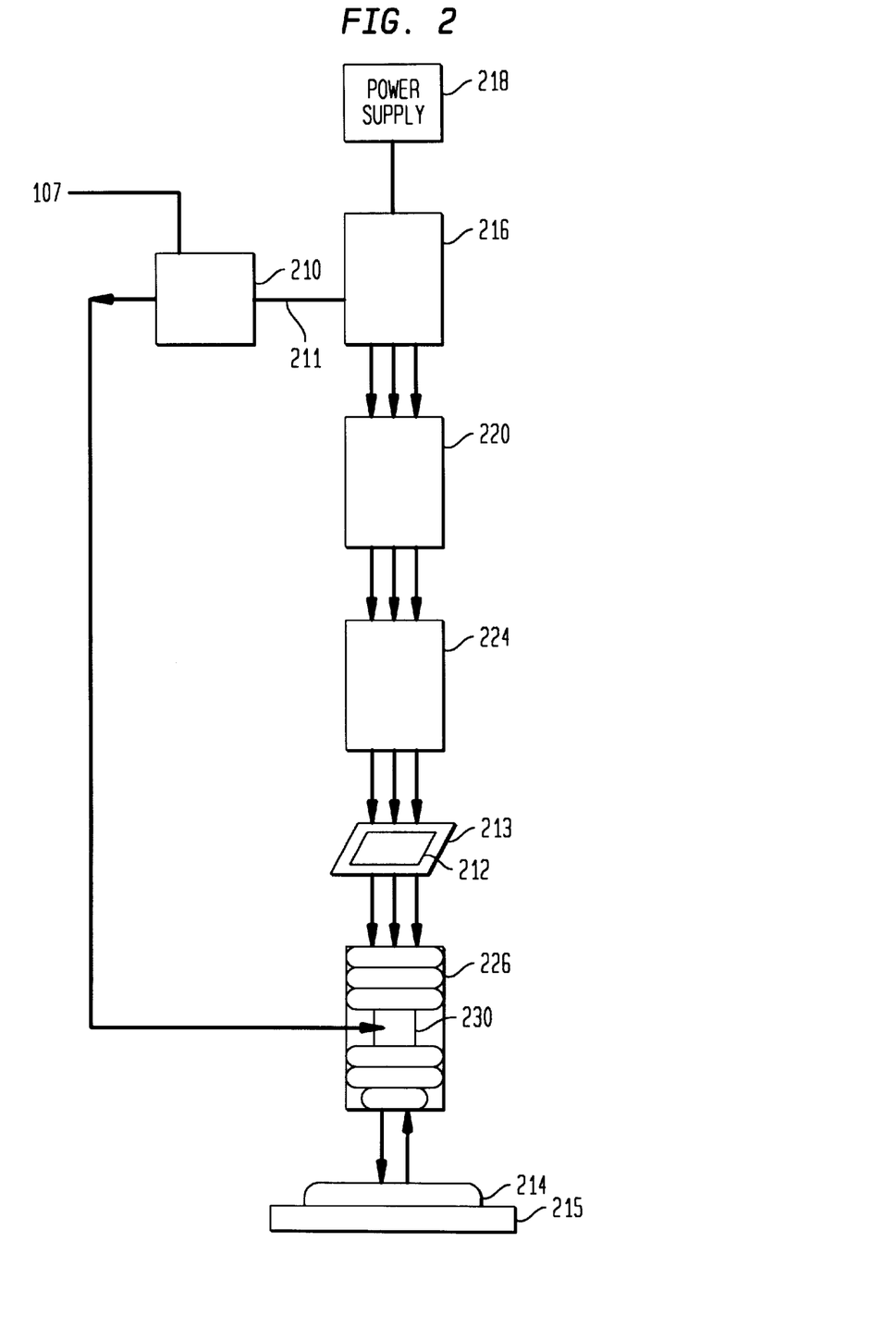
FIG. 2 is a diagrammatical sketch of a lithographical system in accordance with the invention.

Referring to FIG. 2, a lithographic system in accordance with the invention is shown. The lithographic system, which employs scanning or stepping techniques (scanner or stepper), provides improved CD control. The lithographic system 210 comprises an exposure source 216.

The exposure source may be, for example, an ultra violet (UV) such as a mercury arc lamp source or deep ultra violet (DUV) source such as an excimer laser. Other exposure sources for exposing the photoresist are also useful. The exposure source 216 is powered by a power supply 218. Light from the exposure source 216 is directed onto the mask 212. Illustratively, the light is directed onto the mask via the beam delivery system 220 and illuminator 224.

In one embodiment, the beam delivery system includes a shutter. The shutter, which may be mechanical, controls the light path from the exposure source to the mask. The shutter is opened or closed selectively in accordance with a control signal on line 211 from a controller 210.

The mask 12, which in one embodiment is a reticle, has a pattern comprising of regions which are transparent and opaque to light from the exposure source. The regions which are transparent to light is referred herein to as apertures. The mask pattern, for example, corresponds to circuit features that are to be formed on the wafer.

An image of the mask is formed by the light passing through the mask 12. This image is then projected onto the surface of a wafer 215 mounted on a stage 214 by optical system 26 which, for example, is a projection lens. Typically, the wafer comprises semiconductor features covered with a photoresist layer. As shown, the optical system 26 comprises a plurality of lenses. The photoresist layer is exposed by the mask image. After exposure, either the exposed portion or unexposed portion is developed away, depending on whether a positive or negative photoresist is used.

A detector 230 is provided in the lithographic system. The detector senses the amount of energy absorbed by the photoresist within an exposure field. In one embodiment, the absorbed energy is determined by the difference between energy delivered to the surface of the wafer (incident energy) and the energy reflected from the surface of the wafer (reflected energy). Illustratively, the detector is positioned in the optical path of the light energy such as near the aperture of the optical system 226. Since a portion of the light incident to the wafer surface is reflected back toward the projection lens, this advantageously permits the detector to sense the incident energy as well as the reflected energy.

Figure 3:
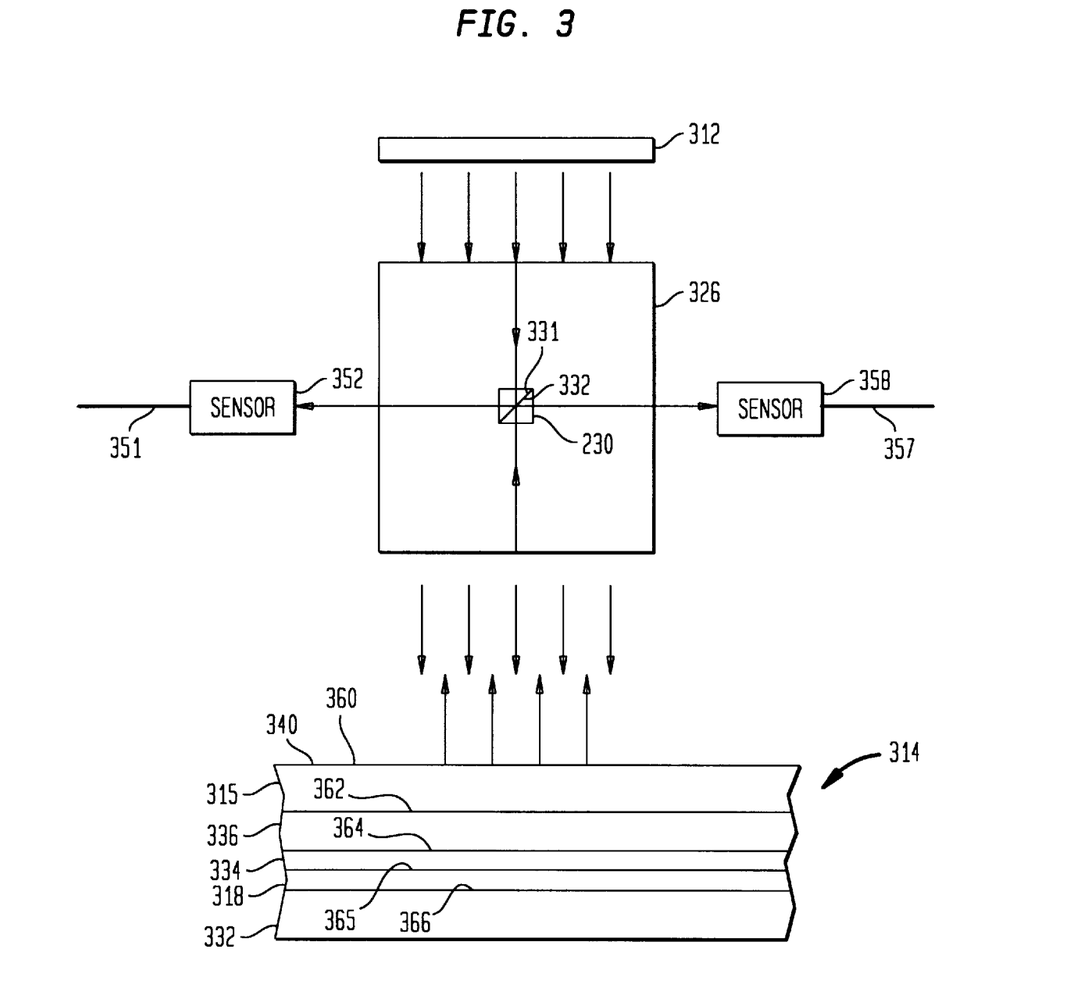
FIG. 3 is a diagrammatical sketch of an enlarged portion of the lithographic system shown in FIG. 2.

The incident and reflected energy signals detected by the detector are input into the controller 210. The difference of these two energies represents the energy absorbed by the photoresist. The controller also receives an external input 209, which is a threshold control signal. The threshold control signal is typically set to equal to about the required exposure dose (dose-to-clear) for the resist. The required exposure dose depends on the type of resist used. Typically, the required exposure dose, although given by a resist manufacturer, is optimized through experimentation. Once the energy absorbed by the photoresist exceeds the threshold or required exposure dose, radiation to the exposure field is terminated. In one embodiment, radiation is terminated by closing the shutter in the beam delivery optical system. Thus radiation is effectively prevented from reaching the photoresist on the wafer. The lithographic system then steps to the next exposure field to expose the resist therein. FIG. 3 shows the detector 230 in greater detail. Radiation from the exposure source forms an image of a mask 312 having a pattern which is projected onto a wafer 314 mounted on a stage by optical system 326. The mask, for example, comprises openings that allow radiation from the exposure source to pass through, illuminating the wafer with the mask pattern. The wafer includes, for example, circuit features formed in and/or on a substrate 332. These circuit features are selectively interconnected by a metal layer 334, which is separated by an interlevel dielectric layer 318, to produce the desired electrical functions. A dielectric layer 336, such as, for example, silicon dioxide or silicon nitride, is typically disposed on the metal layer 334. Disposed on the dielectric layer 336 is the photoresist layer 315. Of course, additionally device layers can be included on the wafer or layers which are depicted are absent from the wafer.

Radiation energy passing through the mask apertures is directed by the optical system 326 onto the upper surface portion 340 of the photoresist 315 layer disposed under, (i.e., in registration with), the mask 312. The area being exposed is referred to as an exposure field. The amount radiation energy absorbed by the photoactive material in the photoresist layer 315 affects the openings that are to be formed in the therein.

The desired exposure dose is equal to about the amount of energy absorbed by the photoresist that produces openings having the desired dimensions or CDs. The desired exposure dose is refereed to as the dose-to-clear. When the level of the energy absorbed by the photoresist layer 315 exceeds the dose-to-clear, so does the CDs of the openings formed therein after development. This condition is referred to as overexposure. Under exposure, which is the situation where the level of energy absorbed by the photoresist layer is less than the dose-to-clear, results in smaller CDs in the openings of the photoresist layer. As previously discussed, the dose-to-clear is optimized by experimentation. Although the invention thus far has been described with respect to the use of positive photoresist, negative photoresist is also useful.

As shown, the detector 230 is located near the aperture of the optical system 226. The detector 230 is used to determine the energy absorbed by the photoresist layer 314. As previously mentioned, the energy absorbed by the photoresist is determined by the difference between the incident energy and reflected energy.

In one embodiment, the detector 230 comprises a mirror having reflective surfaces 331 and 332. The mirror is sufficiently small so as not to affect or distort the illumination or exposure field. In one embodiment, the mirror is $\leq$ about 10% of the aperture of the optical system 326, preferably from about 1–10%, more preferably about 1–5%, more preferably about 1–2%, even more preferably about 1%, and most preferably $\leq$ about 1%. The smaller the mirror, the less it distorts the illumination field.

As the radiation energy passes through the optical system to illuminate the wafer, a portion of it contacts surface 331 of the mirror and is reflected toward a sensor 352. The energy sensed by the sensor is indicative of the amount of energy that illuminates the wafer. The sensor converts the energy sensed to an electrical signal 351. The sensor comprises, for example, a photodiode. Other radiation sensors are also useful. The electrical signal generated by the sensor varies according to level of energy detected and corresponds to or is used to detect the incident energy.

As the radiation energy contacts the wafer surface, a portion of the incident light energy is reflected back towards the detector 230 at various interfaces between different materials. For example, energy is reflected from: the air-photoresist layer interface 360; the photoresist layer-dielectric layer interface 362; the dielectric layer-metal layer interface 364; metal layer-dielectric layer interface 365; and the dielectric layer-substrate interface 366. A portion of incident energy is reflected back towards the detector and contacts surface 231. Surface 231 directs the reflected energy towards sensor 358 which is, for example, similar to sensor 352. The energy sensed by sensor 358 is used to determine or corresponds to the reflected energy from the wafer.

Alternatively, the detector 230 comprises a prism having a partially reflective surface. As energy from the exposure source passes through the prism, a portion of it is reflected toward sensor 352. Sensor 352 generates a output that is used to determine the incident energy. As the energy contacts the wafer surface, a portion of the incident light energy is reflected back towards the detector 230 at various interfaces between different materials. A portion of the reflected energy is directed towards sensor 358, which generates a signal used to determine the reflected energy from the wafer.

The prism, for example, is a beam splitter with 50% reflectivity, resulting in half the energy being passed through to the wafer surface and half being reflected and sensed by sensor 352. Thus, the amount of energy sensed by sensor 352 is equal to about the amount of energy incident on the wafer. The beam splitter also reflects about 50% of the reflected energy toward sensor 358. Since this represents only half of the reflected energy, it is multiplied by 2 to correspond to the energy reflected. Prisms with other reflectivity are also useful. However, when using prisms with other reflectivity, the signals generated by the sensors are adjusted to accurately correspond to the incident and reflected energies.

Figure 4:
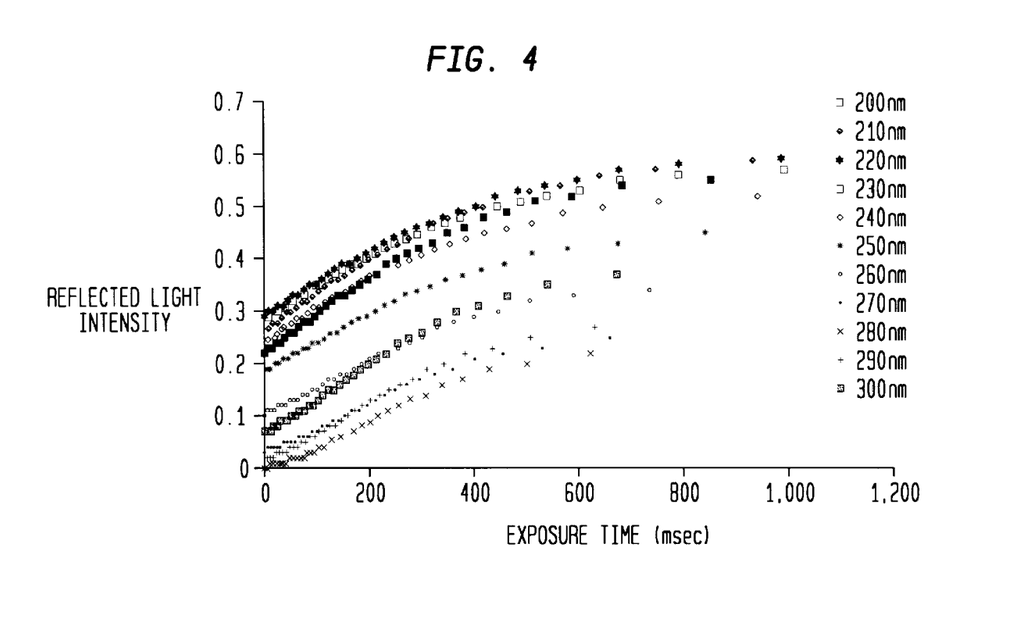
FIG. 4 shows a plot of simulation results of reflected light intensity as a function of exposure time for various silicon dioxide dielectric thicknesses on the substrate.

Due to bleaching of the photoresist, the reflectivity of the wafer changes during exposure. FIG. 4 shows simulations for this change using different "incoupling" conditions (i.e., different thicknesses of a silicon dioxide dielectric layer disposed underneath the photoresist layer). As can be seen, the reflectivity of the wafer increases with exposure time. To compensate for this change in reflectivity, the reflected intensity during exposure is integrated over time, resulting in the following equation to determine the energy absorbed by the photoresist layer:

$$E_{absorbed} = \int_{t=0}^{t=T} I_{incident} dt - \int_{t=0}^{t=T} I_{reflected} dt$$

where:

$E_{absorbed}$=the energy absorbed by the photoresist layer 15;

$I_{incident}$=the incident light intensity measured by the first light sensor 352;

$I_{reflected}$=the reflected light intensity measured by the second light sensor 358; and T=time lapsed after beginning the light exposure.

Figure 5:
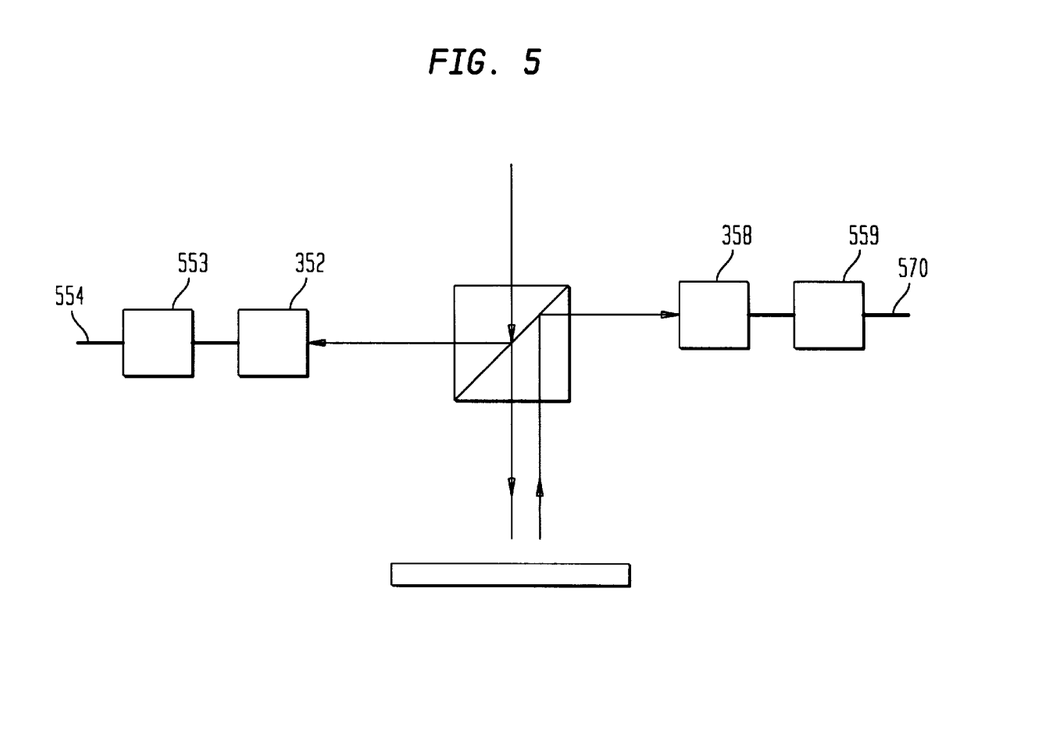
FIG. 5 is a diagrammatical sketch of an enlarged portion of another embodiment of the invention.

Referring to FIG. 5, another embodiment of the invention is shown. As shown, integrators 553 and 559 are provided to integrate signals generated by sensors 352 and 358, respectively. Thus, signal 670 generated by integrator 559 represents the reflected energy integrated over time and signal 554 represents the incident energy integrated over time. Signals 554 and 570 are then input into the controller 210 (See FIG. 2), which takes the difference between the signals to obtain the energy absorbed by the photoresist.

Figure 6:
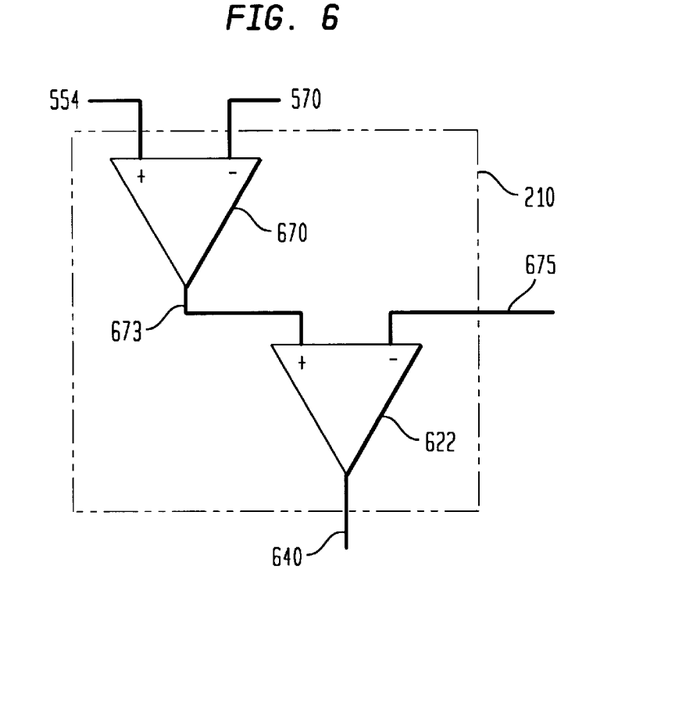
FIG. 6 is a controller in accordance with one embodiment of the invention.

Referring to FIG. 6, an exemplary controller 210 is shown in greater detail. As shown, the controller receives the integrated incident and integrated reflected energy signals 554 and 570. These signals are input into a differencing amplifier 670, producing an output 673 representative of the energy absorbed ($E_{absorbed}$) by the photoresist layer 15. Signal 673 is fed to the comparator 622, along with a threshold level signal 675.

In one embodiment, the threshold level signal is equal to about the required exposure dose. When the level of signal 673 equals to about the level of the threshold signal, comparator 622 generates an active signal 640. Active signal 640 represents an endpoint exposure signal which is used to terminate the delivery of radiation to the exposure field. In one embodiment, signal 640 is used to control a shutter in, for example, the beam delivery optical system. When signal 640 is active, the shutter is closed to block radiation from reaching the wafer.

Thus, in accordance with the invention, the exposure of every exposure field is timed by the amount of energy absorbed by the photoresist in that field. By timing the exposure field according to the energy absorbed or the required exposure dose, CD control is significantly improved.

Figure 7:
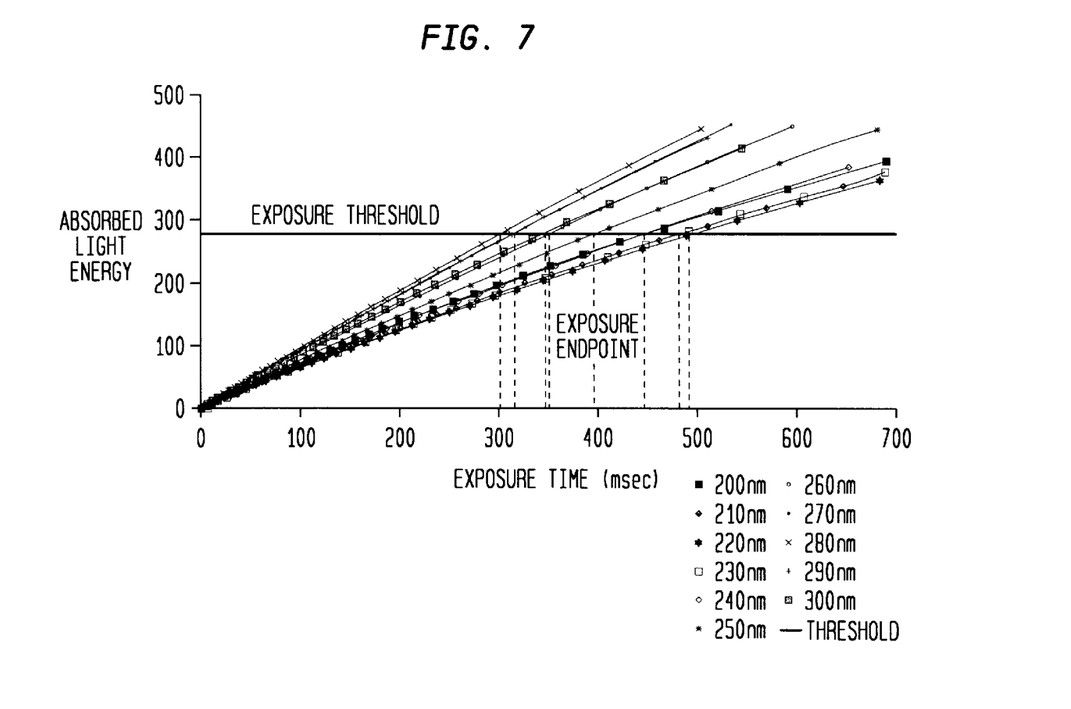
FIG. 7 are curves showing the relationship between absorbed energy computed as described above as a function of exposure time for silicon dioxide dielectric layers of a variety of thickness.

A simulation of the amount of exposure radiation energy absorbed by dielectric layers with varying thicknesses over time was performed. The results of this simulation is plotted in FIG. 7. Choosing an arbitrary exposure threshold ($m^3/cm^2$) representing the required exposure dose of the photoresist layer, it can be seen that as the thickness of dielectric layer increases, so does the time it takes to achieved the required exposure dose. Thus, using the required exposure dose as endpoint control, the exposure of each exposure is terminated when the absorbed energy exceeds the threshold energy.

Figure 8:
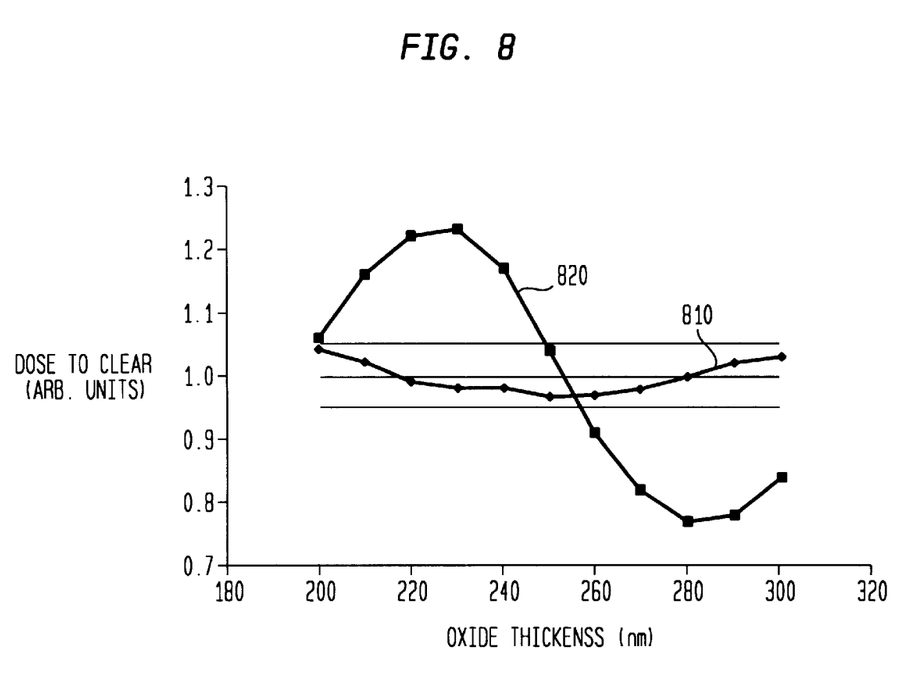
FIG. 8 are curves showing the ratio of dose to clear as a function of dielectric silicon dioxide layer thickness with, and without, endpoint detection in accordance with the invention.

A simulation of dose to clear variation over different oxide thicknesses was performed. The results of this simulation are plotted in FIG. 8. Line 810 represents the results with end point exposure control in accordance with the invention and line 820 represents the results without end point exposure. As shown, the dose variation with endpoint detection is ≧ about +/−25% while the variation with endpoint detection is about ≦about +/−4%. Thus, dose control using end point exposure detection is significantly better. In fact, such dose control is comparable or better than that achieved with organic anti-reflective coating (ARC).

What is claimed is:

1. A method for transferring a mask pattern to a photoresist layer, comprising:

illuminating a mask comprising the mask pattern with radiation from an exposure source to create an image of the mask pattern;

projecting the image onto a photoresist layer;

detecting an amount of radiation absorbed by the photoresist layer;

terminating the radiation to the photoresist at a time T when the amount of energy absorbed by the photoresist layer exceeds a threshold level; and wherein the detecting the amount of radiation absorbed by the photoresist layer comprises:

measuring the intensity, $I_{intensity}$, of incident radiation from the exposure source on the photoresist layer and integrating such measured intensity, $I_{intensity}$, in accordance with $$\int_{t=0}^{t=T} I_{incident} dt,$$

where t is time;

measuring the intensity, $I_{reflected}$, of a portion of the incident radiation that is reflected radiation from the photoresist layer and integrating such measured intensity, $I_{reflected}$, in accordance with;

$$\int_{t=0}^{t=T} I_{reflected} dt;$$

taking the difference of;

$$\int_{t=0}^{t=T} I_{incident} dt \text{ and } \int_{t=0}^{t=T} I_{reflected} dt;$$

and terminating the exposure at the time T in accordance with the determined difference.

* * * * *